United States Patent [19]
Hatada

[11] Patent Number: 5,272,389
[45] Date of Patent: Dec. 21, 1993

[54] LEVEL SHIFTER CIRCUIT
[75] Inventor: Akiyoshi Hatada, Itami, Japan
[73] Assignee: Mitsubishi Denki Kabushiki Kaisha, Tokyo, Japan
[21] Appl. No.: 875,978
[22] Filed: Apr. 29, 1992
[30] Foreign Application Priority Data
  May 21, 1991 [JP] Japan ................. 3-115907
[51] Int. Cl.⁵ .......................... H03L 5/00
[52] U.S. Cl. .................. 307/264; 307/279
[58] Field of Search ......... 307/261, 264, 268, 279, 307/291

[56]       References Cited
       U.S. PATENT DOCUMENTS

| | | | |
|---|---|---|---|
| 4,039,862 | 8/1977 | Dingwall et al. | 307/264 |
| 4,695,744 | 9/1987 | Giordano | 307/264 |
| 4,703,199 | 10/1987 | Ely | 307/264 |
| 4,845,381 | 7/1989 | Cuevas | 307/264 |
| 4,982,111 | 1/1991 | Nakaizumi | 307/279 |
| 5,136,190 | 8/1992 | Chern et al. | 307/264 |

Primary Examiner—William L. Sikes
Assistant Examiner—Toan Tran
Attorney, Agent, or Firm—Thomas R. Morrison

[57]  ABSTRACT

A level shifter circuit includes first and second inverter circuits comprising first and second PMOS transistor and an NMOS transistor which are connected in series between a point of first potential $V_{LC}$ and a point of ground potential, connections interconnecting the output nodes of the respective ones of the inverter circuits to the gates of the second PMOS transistors of the respective other inverter circuits, an input signal circuit for providing to the inverter circuits respective input signals Sa, Sb which changes in a substantially complementary manner between a second potential $V_{DD}$ and ground potential, and a level setting circuit for forcibly setting the respective output nodes of the inverter circuits to the second potential $V_{DD}$ when a signal applied to said input signal circuit changes. The second potential $V_{DD}$ is equal to or less than the first potential $V_{LC}$.

12 Claims, 5 Drawing Sheets

LEVEL SHIFTER CIRCUIT

This invention relates to a level shifter circuit formed in an LSI, for shifting a potential level of an input pulse signal, for example in a digital signal processing system, to a different fixed level, and more particularly to such a level shifter circuit with reduced power consumption.

BACKGROUND OF THE INVENTION

FIG. 1 illustrates an example of conventional level shifter circuit. PMOS transistor 1 and 2 and an NMOS transistor 3 are connected in series between a supply terminal 4 providing a first potential $V_{LC}$, and a ground potential point, to thereby form a first circuit 51 which acts as a CMOS inverter circuit when the PMOS transistor 2 is ON, as will be described later. (Hereinafter, the first circuit 51 is referred to as first inverter circuit 51.) Similarly, PMOS transistor 5 and 6 and an NMOS transistor 7 are connected in series between the supply terminal 4 and the ground potential point to form a second circuit 52 which acts as a CMOS inverter circuit when the PMOS transistor 6 is ON, as will be described later. (Similarly, the second circuit 52 is referred to as second inverter circuit 52.) A junction between the drain of the PMOS transistor 2 and a drain of the NMOS transistor 3 forms an output node 8 of the first inverter circuit 51. The output node 8 is connected to a gate of the PMOS transistor 6 of the second inverter circuit 52. Similarly, a junction between a drain of the PMOS transistor 6 and a drain of the NMOS transistor 7 forms an output node 9 of the second inverter circuit 52, which is connected to a gate of the PMOS transistor 2 of the first inverter circuit 51. In this example, an output 10 at which a level-shifted output signal $S_{out}$ is developed is connected to the output node 9 of the second inverter circuit 52.

An input terminal 11, at which an input signal, such as $S_{IN}$ shown in FIG. 2(a), is applied, is coupled to a gates of the PMOS transistor 1 and the NMOS transistor 3 of the first inverter circuit 51 and also to an input of a CMOS inverter 12. An output of the CMOS inverter 12 is coupled to gates of the PMOS transistor 5 and the NMOS transistor 7 of the second inverter circuit 52. The CMOS inverter 12 is operated from a second voltage $V_{DD}$ which is supplied from a voltage supply terminal 13. The input signal $S_{IN}$ has an H-level at $V_{DD}$ and an L-level at the ground potential. An output signal $\overline{S_{IN}}$ of the CMOS inverter 12 is the inversion of the input signal $S_{IN}$, and has an H-level at $V_{DD}$ and an L-level at the ground potential.

Let it be assumed that the level shifter circuit of FIG. 1 is used, for example, as a liquid crystal driver circuit and that the first potential $V_{LC}$ is 3 volts. Also, let it be assumed that a voltage $V_{DD}$, which is the operating voltage for the circuit (not shown) for producing the signal $S_{IN}$ and for the inverter 12 for producing the inverted signal $\overline{S_{IN}}$, is 2 volts. Then, the level shifter circuit of FIG. 1 operates to produce, from the input signal having an H-level of 2 V, an output signal $S_{OUT}$ having an H-level fixed at 3 V. In other words, the level shifter circuit of FIG. 1 operates to shift the H-level from 2 V to 3 V.

In operation, when the input signal $S_{IN}$ goes down to the ground level, the ground potential is applied to the gates of the PMOS transistor 1 and the NMOS transistor 3 of the first inverter circuit 51, whereas $V_{DD}=2$ V is applied to the gates of the PMOS transistor 5 and the NMOS transistor 7 of the second inverter circuit 52. This turns on the PMOS transistor 1 and turns off the NMOS transistor 3. Although $V_{DD}=2$ V is applied to the gate of the PMOS transistor 5, the PMOS transistor 5 exhibits high resistance and is not turned off completely, since $V_{LC}=3$ V is applied to its source. On the other hand, the NMOS transistor 7 becomes fully conductive. The NMOS transistor 7 is designed to have a sufficiently small ON-resistance such that even when the PMOS transistor 6 is conductive, the output signal $S_{OUT}$ is substantially at the ground potential. When the output signal $S_{OUT}$ is at the ground potential, the PMOS transistor 2 is turned on. Because the PMOS transistor 1 is conductive and the NMOS transistor 3 is non-conductive as stated previously, the output node 8 of the first inverter circuit 51 assumes $V_{LC}$ upon the turning on of the PMOS transistor 2. This causes the PMOS transistor 6 to be turned off. As the PMOS transistor 6 is turned off, the output signal $S_{OUT}$ at the output terminal 10 is maintained at the ground potential even when the PMOS transistor 5 has not yet turned off completely.

When the input signal $S_{IN}$ goes to $V_{DD}$, $V_{DD}$ is applied to the gates of the PMOS transistor 1 and the NMOS transistor 3 of the first inverter circuit 51, while the ground potential is applied to the gates of the PMOS transistor 5 and the NMOS transistor 7 of the second inverter circuit 52. This causes the PMOS transistor 5 to be turned on and the NMOS transistor 7 to be turned off. However, since the previous state of the PMOS transistor 6 is the OFF state, the output node 9, i.e. the output terminal 10 is instantaneously floating. On the other hand, $V_{DD}=2$ V is applied to the gate of the PMOS transistor 1 of the first inverter circuit 51, but its source potential is $V_{LC}=3$ V. Therefore, the PMOS transistor 1 exhibits high resistance but it does not become fully non-conductive. Because of $V_{DD}$ applied to the gate of the NMOS transistor 3, it becomes fully conductive. The NMOS transistor 3 is designed to have such a small ON-resistance, that under this condition, even if the PMOS transistor 2 is conductive, the output node 8 of the inverter circuit 51 is substantially at the ground potential. With the output node 8 being at the ground potential, the PMOS transistor 6 is turned on. At this time, the PMOS transistor 5 is conductive, and the NMOS transistor 7 is non-conductive. Accordingly, the potential at the output node 9 and, at the output terminal 10 is $V_{LC}=3$ V. Thus, the output signal $S_{OUT}$ results, which has the H-level at $V_{LC}=3$ V which is a level-shifted version of the H-level of the input signal $S_{IN}$ at $V_{DD}=2$ V. As the output terminal 10 goes to $V_{LC}$, the PMOS transistor 2 is turned off. Under this condition, even when the PMOS transistor 1 is not fully non-conductive, no current will flow from the first supply terminal 4 through the first inverter circuit 51 to the ground potential point. The output signal $S_{OUT}$ on the pulse varying between the ground potential and $V_{LC}=3$ V may be used as a signal for driving a liquid crystal device.

In the conventional level shifter circuit of the above-described configuration, current will flow from the first supply terminal 4 to the ground potential point through the PMOS transistors 5 and 6 and the NMOS transistor 7 of the second inverter circuit 52 at an instant when the input signal $S_{IN}$ changes from $V_{DD}$ (=2 V) to the ground potential, and, also, current will flow from the first supply terminal 4 to the ground potential point through the PMOS transistors 1 and 2 and the NMOS transistor 3 of the first inverter circuit 51 at an instant when the input signal $S_{IN}$ changes from the ground potential to $V_{DD}$. This disadvantageously increases operating power consumption of the level shifter circuit.

The present invention is to eliminate the above-described disadvantage and to provide a level shifter circuit with reduced operating power consumption.

SUMMARY OF THE INVENTION

According to the present invention, a level shifter circuit includes first and second inverter circuits, each of which includes a series combination of first and second PMOS transistors and an NMOS transistor connected in series between a point of first potential and a point of reference potential, such as, for example, a point of ground potential. The level shifter circuit further includes a connecting circuit which connects an output node of the first inverter circuit to a gate of the second PMOS transistor of the second inverter circuit, and a connecting circuit which connects an output node of the second inverter circuit to a gate of the second PMOS transistor of the first inverter circuit. An input signal circuit applies to inputs of the first and second inverter circuits, respective input signals which change in a substantially complementary fashion between a second potential equal to or lower than the first potential and the reference potential and which simultaneously assume the ground potential for a short time period. An output level setting circuit is responsive to the input signals to forcibly set the output nodes of the respective inverter circuits to the second potential for a short time period when the input signals change.

Because the output nodes of the respective inverter circuits are forcibly set to the second potential when the input signals change, the second PMOS transistors of the respective inverter circuits exhibit increased ON-resistance when the input signals change. Accordingly, currents flowing through the respective inverter circuits from the first potential point to the reference potential point is reduced, which, in turn, results in reduction of power consumption of the level shifter circuit as a whole.

DESCRIPTION OF THE PREFERRED EMBODIMENTS

Now, the present invention is described with reference to the accompanying drawings.

EMBODIMENT 1

Figure 1:
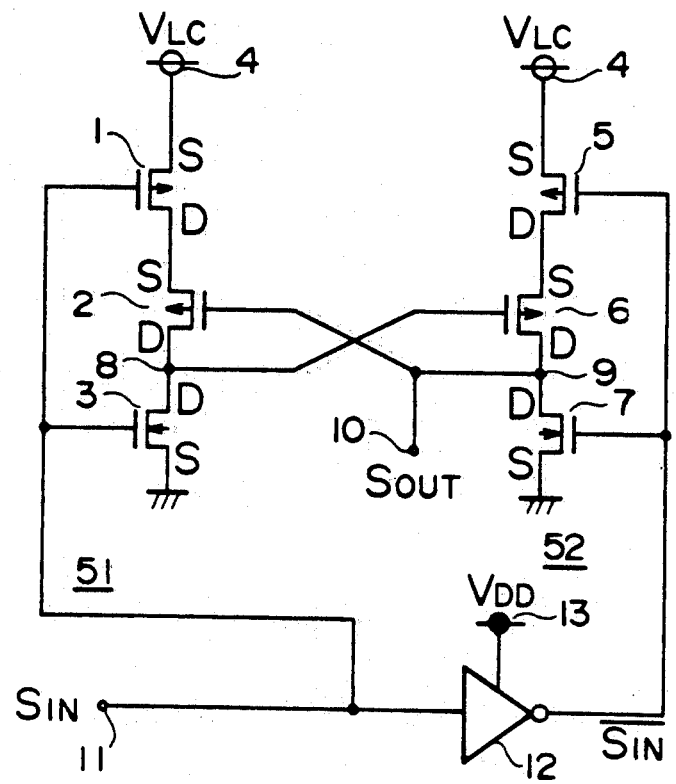
FIG. 1 is a circuit diagram of a conventional level shifter circuit.
Figure 2:
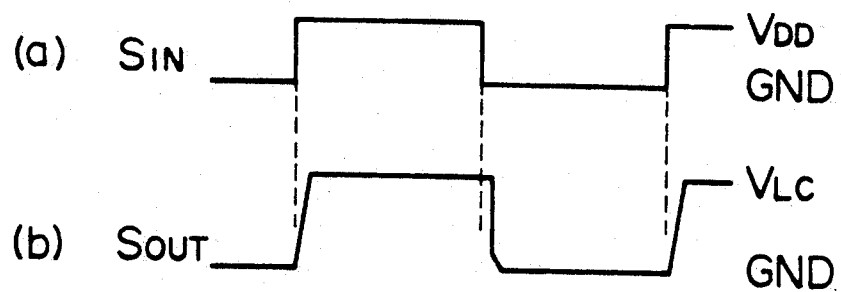
FIG. 2 shows waveforms for use in explaining the operation of the conventional level shifter circuit of FIG. 1.
Figure 3:
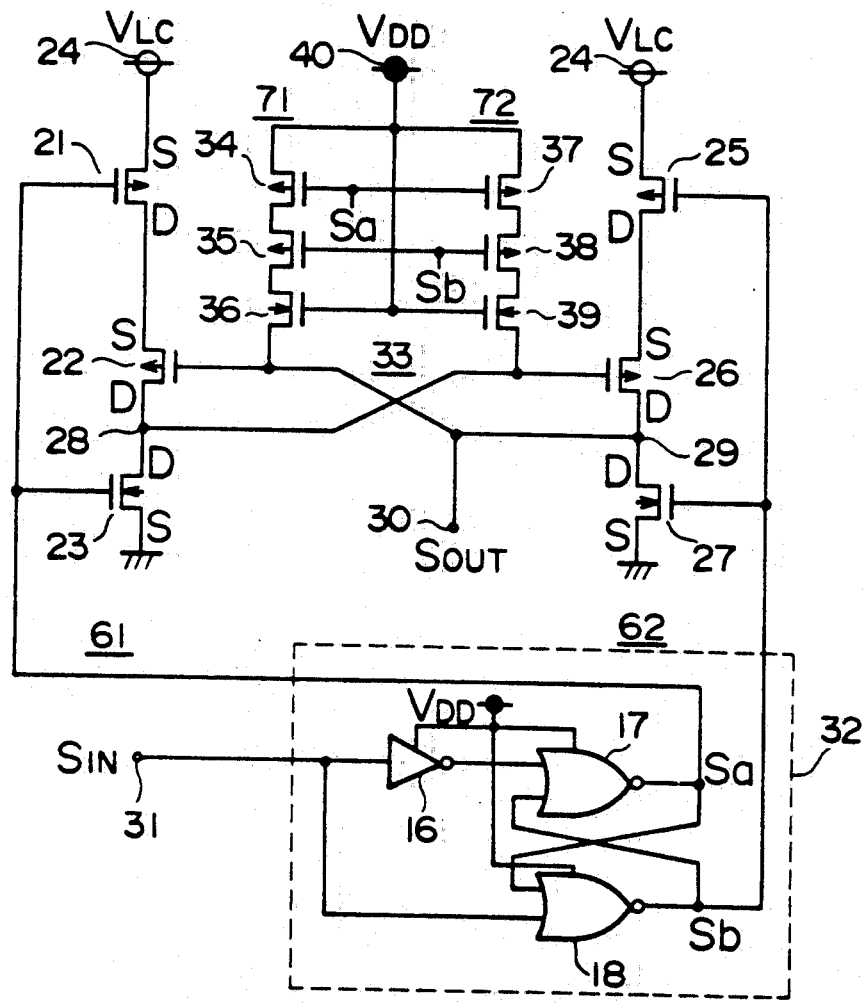
FIG. 3 is a circuit diagram of a level shifter circuit according to a first embodiment of the present invention.

FIG. 3 shows a level shifter circuit according to a first embodiment of the present invention. Like the conventional level shifter circuit shown in FIG. 1, the level shifter circuit shown in FIG. 3 may be used as, for example, a liquid crystal driver circuit. A first inverter circuit 61 includes a series combination of first and second PMOS transistors 21 and 22 and an NMOS transistor 23, which is connected between a supply terminal of first potential $V_{LC}$, which is assumed to be 3 V in this embodiment, and a point of reference potential, for example, ground potential. A second inverter circuit 62 includes a series combination of first and second PMOS transistors 25 and 26 and an NMOS transistor 27, which is connected between the supply terminal 24 and a point of reference potential, for example, ground potential. Mutually connected drains of the second PMOS transistor 22 and the NMOS transistor 23 of the first inverter circuit 61 provides an output node 28 of the first inverter circuit 61. The output node 28 is connected to a gate of the second PMOS transistor 26 of the second inverter circuit 62. Similarly, drains of the second PMOS transistor 26 and the NMOS transistor 27 of the second inverter circuit 62 are connected together to form an output node 29 of the second inverter circuit 62. The output node 29 is connected to a gate of the second PMOS transistor 22 of the first inverter circuit 61, and also to an output terminal 30 of the level shifter circuit.

An input signal circuit 32 receives an input signal $S_{IN}$ such as shown in FIG. 4(a) at an input terminal 31 and generates therefrom first and second input signals Sa and Sb, shown in FIGS. 4(b) and 4(c), which are applied to the first and second inverter circuits 61 and 62, respectively. The input signal circuit 32 may include a CMOS inverter 16, a NOR circuit 17 to which an output of the inverter 16 is connected to one input thereof, and a NOR circuit 18 which receives the input signal $S_{IN}$ at its one input. An output of the NOR circuit 17 is connected to another input of the NOR circuit 18, and the output of the NOR circuit 18 is connected to the other input of the NOR circuit 17. The input signal circuit 32 is operated from a second potential $V_{DD}$, which is assumed to be 2 V in this embodiment. When the input signal $S_{IN}$ applied to the input terminal 31 rises to the H-level which is equal to $V_{DD}$, the signal Sb developed at the output of the NOR circuit 18 in response to the rising of the input signal $S_{IN}$ changes immediately to the ground potential. On the other hand, the output of the NOR circuit 17 changes to the H-level, i.e. $V_{DD}$, because the output of the inverter 16 goes to the L-level and the signal Sb is at the L-level, i.e. ground potential. Thus, when the input signal $S_{IN}$ rises to the H-level, the signal Sa developed at the output of the NOR circuit 17 rises to $V_{DD}$ after a delay equal to t.

When the input signal $S_{IN}$ changes from the H-level to the ground potential, i.e. the L-level, the output of the inverter 16 changes to the H-level, and, accordingly, the signal Sa developed at the output of the NOR circuit 17 immediately changes to the ground potential level. On the other hand, the output of the NOR circuit 18 changes to the H-level, i.e. $V_{DD}$, in response to the input signal $S_{IN}$ falling to the L-level and the output of the NOR circuit 17 falling to the L-level or ground potential. Thus, when the input signal $S_{IN}$ falls, the signal Sb rises to $V_{DD}$ after a delay equal to t.

Figure 4:
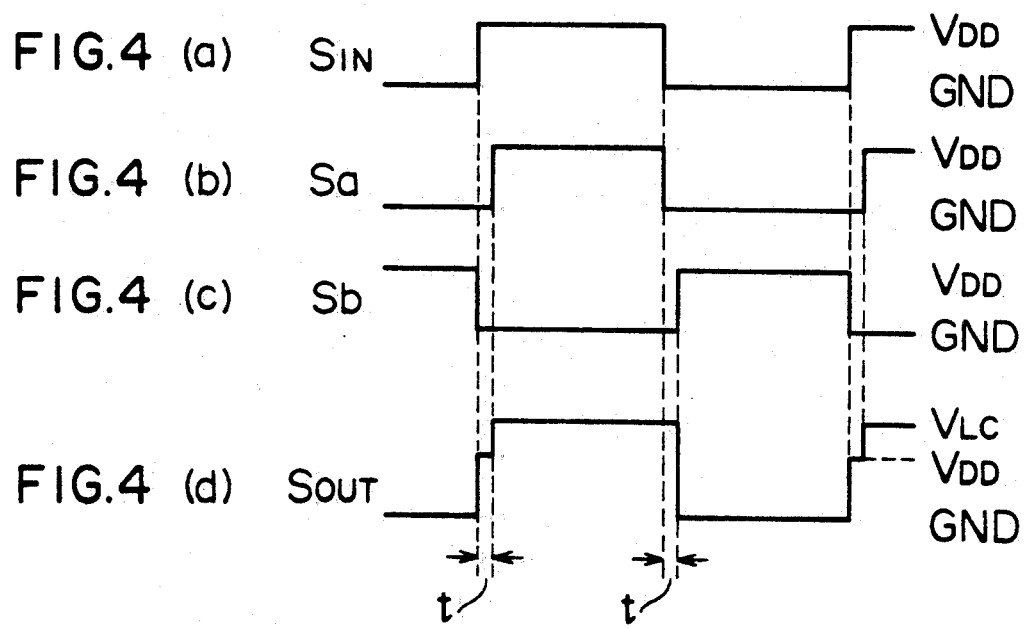
FIGS. 4a–4d show waveforms for use in explaining the operation of the level shifter circuit of the present invention shown in FIG. 3.

Thus, as shown in FIG. 4, in response to changes in level of the input signal $S_{IN}$, the signals Sa and Sb change in a substantially complementary fashion, but they are simultaneously at the ground potential for the time period t immediately after the level of the input signal $S_{IN}$ changes. The signal Sa is applied as an input signal to a gate of the PMOS transistor 21 which is the input of the first inverter circuit 61 and also to a gate of the NMOS transistor 23. Similarly, the signal Sb is applied as an input signal to a gate of the PMOS transistor 25 which is the input of the second inverter circuit 62 and also to a gate of the NMOS transistor 27.

An output level setting circuit 33 sets the output levels of the respective inverter circuits, and includes a first series combination 71 of PMOS transistors 34, 35 and an NMOS transistor 36 connected in series between a supply terminal 40 of the second potential $V_{DD}$ and the output node 29 of the second inverter circuit 62. The circuit 33 further includes a second series combination 72 of PMOS transistors 37, 38 and an NMOS transistor 39 connected in series between the supply terminal 40 and the output node 28 of the first inverter circuit 61. The signal Sa is applied to gates of the PMOS transistors 34 and 37 from the input signal circuit 32, the signal Sb is applied to a gates of the PMOS transistors 35 and 38 from the input signal circuit 32, and the second potential $V_{DD}$ is applied to a gates of the NMOS transistors 36 and 39.

The operation of the level shifter circuit of FIG. 3 is below described.

The digital input signal $S_{IN}$, having an H-level which is equal to $V_{DD}=2$ V and an L-level which is equal to the ground potential, is applied to the input terminal 31. When the input signal $S_{IN}$ is at the L-level, the signal Sa is at the ground potential and the signal Sb is at $V_{DD}$. Thus, the ground potential is applied to the gates of the PMOS transistor 21 and the NMOS transistor 23, whereas $V_{DD}$ is applied to the gates of the PMOS transistor 25 and the NMOS transistor 27. The NMOS transistor 27 immediately turns on, however, the PMOS transistor 25 does not turn off completely and exhibits a high resistance since its source is at $V_{LC}=3$ V and its gate is at $V_{DD}=2$ V. The NMOS transistor 27 is designed to have a sufficiently small ON-resistance so as to place the potential at the output node 29 and, hence, the output signal $S_{OUT}$ at the output terminal 30, near the ground potential even when the PMOS transistor 26 is conductive under this condition.

The level shifter circuit of the present invention is characterized in that the signals Sa and Sb are simultaneously at the ground potential for a short time period t when the level of the input signal $S_{IN}$ changes, and that the output level setting circuit 33 is disposed between the $V_{DD}$ supply terminal 40 and the output nodes 28 and 29 of the inverters 61 and 62.

Because the signals Sa and Sb are simultaneously at the ground potential for a time period t when the input signal $S_{IN}$ changes to the L-level, the PMOS transistors 34, 35, 37 and 38 of the output level setting circuit 33 are turned on, and the NMOS transistors 36 and 39 are also turned on because of $V_{DD}$ applied to their gates. Accordingly, during a time period t when both the signals Sa and Sb are at the ground potential, the output nodes 28 and 29 of the inverters 61 and 62 are forcibly set to $V_{DD}$. Thus, for a time period t immediately after the input signal $S_{IN}$ changes to the L-level, the gate of the PMOS transistor 26 is set to $V_{DD}$ so that the resistance of the PMOS transistor 26 is considerably larger than that of the corresponding PMOS transistor in the conventional circuit during time period t (e.g. PMOS transistor 6 in the circuit of FIG. 1). Thereafter, when the signal Sb changes to $V_{DD}$, current flowing from the first potential $V_{LC}$ at supply terminal 24 through the second inverter circuit 62 to the ground potential point is significantly smaller than in the prior art.

When the PMOS transistors 25 and 26 both exhibit high resistance and the NMOS transistor 27 is turned on so that the output signal $S_{OUT}$ at the output terminal 30, is near the ground potential, the PMOS transistor 22 in the first inverter circuit 61 is turned on. Since the PMOS transistor 21 has been already turned on and the NMOS transistor 23 has been turned off, the output node 28 is placed at $V_{LC}$ so that the second PMOS transistor 26 of the second inverter circuit 62 becomes completely non-conductive. When the PMOS transistor 26 is non-conductive, the output signal $S_{OUT}$ is maintained at the ground potential, since the NMOS transistor 27 has been already turned on.

Next, when the input signal $S_{IN}$ assumes the H-level, which is equal to the second potential $V_{DD}$, the signal Sa becomes $V_{DD}$ and the signal Sb becomes the ground potential. This causes the PMOS transistor 25 and the NMOS transistor 27 of the second inverter circuit 62 to become conductive and non-conductive, respectively. However, because the PMOS transistor 26 is non-conductive in the immediately preceding condition, the output node 29 and the output terminal 30 are instantaneously in the floating state. Concurrently, the NMOS transistor 23 of the first inverter circuit 61 is immediately turned on, but the PMOS transistor 21 is not completely turned off, thus exhibiting a high resistance, because its source is at $V_{LC}$ (=3 V) and its gate is at $V_{DD}$ (=2 V). The geometry of the NMOS transistor 23 is designed to provide a sufficiently small ON-resistance so that the output node 28 is near the ground potential even though the PMOS transistor 22 is conductive under this condition.

As described previously, according to the present invention, because the signals Sa and Sb are simultaneously at the ground potential for a time period t when the input signal $S_{IN}$ changes so that all of the PMOS transistors 34, 35, 37 and 38 of the output level setting circuit 33 are turned on, and the NMOS transistors 36 and 39 are also conductive. Thus output nodes 28 and 29 of the inverter circuits 61 and 62 are thereby forcibly set to $V_{DD}$ for a time period t during which the signal Sa and the signal Sb are simultaneously at the ground potential, which occurs immediately after the input signal $S_{IN}$ changes to the H-level. This increases the ON-resistance of the PMOS transistor 22. Accordingly, when the signal Sa changes to $V_{DD}$, current flowing from the first potential supply terminal 24 through the first inverter circuit 61 to the ground potential point is minimized.

When the NMOS transistor 23 is turned on, while the PMOS transistors 21 and 22 are exhibiting high resistance, the output node 28 is placed near the ground potential. The PMOS transistor 26 of the second inverter circuit 62 is thus turned on. Since the PMOS transistor 25 and the NMOS transistor 27 have become conductive and non-conductive, respectively, the output node 29 is placed at $V_{LC}$, which causes the PMOS transistor 22 of the first inverter circuit 61 to become fully non-conductive. When the PMOS transistor 22 becomes non-conductive, the output node 28 is maintained at the ground potential because the NMOS transistor 23 has already become conductive. Thus output signal $S_{OUT}$, developed at the output terminal 30, is set to $V_{LC}$.

The level shifter circuit of FIG. 3 operates as described above to provide the output signal $S_{OUT}$ which switches between the first potential $V_{LC}(=3\ V)$ and the ground potential as shown in FIG. 4(d), in response to the input signal $S_{IN}$ which changes between the first potential $V_{DD}\ (=2\ V)$ and the ground potential, as shown in FIG. 4(a). The output signal $S_{OUT}$ assumes the second potential $V_{DD}=2\ V$, which is lower than the first potential $V_{LC}$, for a short time period t after the input signal $S_{IN}$ changes, but it has no significant influence, for example, in the driving of a liquid crystal.

The NMOS transistors 36 and 39, in the output level setting circuit 33, are provided to prevent current from flowing from the output nodes 28 and 29 back to the supply terminal 40, which provides the second potential $V_{DD}$ lower than $V_{LC}$, when the output node 28 or 29 assumes the first potential $V_{LC}$.

EMBODIMENT 2

Figure 5:
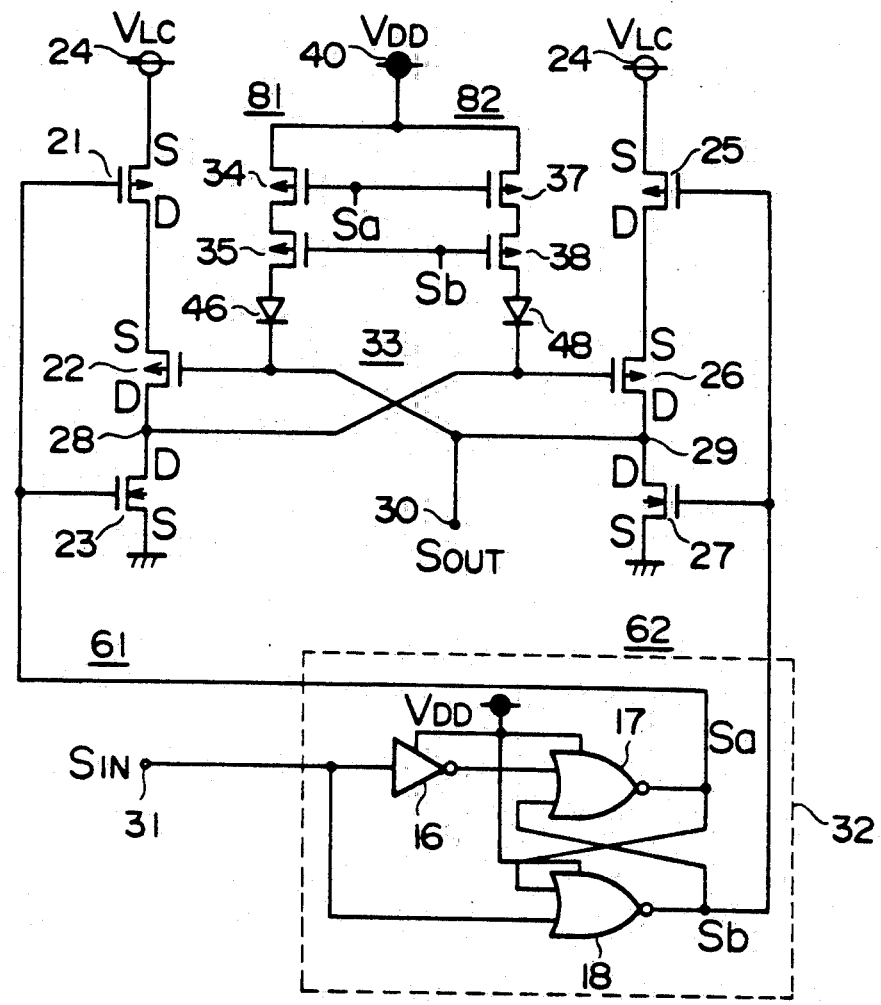
FIG. 5 is a circuit diagram of a level shifter circuit according to a second embodiment of the present invention.

FIG. 5 shows a level shifter circuit according to a second embodiment of the present invention. In this second embodiment, the output level setting circuit 33, which is connected between the terminal 40 providing the second potential $V_{DD}$ and the inverter circuit output nodes 28, 29, comprises a series combination 81 of the PMOS transistors 34, 35 and a diode 46, and a series combination 82 of the PMOS transistors 37, 38 and a diode 48. In this second embodiment, current flow from the output nodes 28 and 29 of the inverter circuits 61 and 62 back to the supply terminal 40, which would be caused when the output nodes 28 and 29 take the first potential $V_{LC}$, is prevented by the diodes 46 and 48. The circuit of FIG. 5 is similar to the circuit of FIG. 3 in the arrangement of the remaining portion, and its operation is similar to that of the circuit of FIG. 3.

Similar results can be obtained by connecting one diode between the terminal 40 and the junction of the sources of the PMOS transistors 34 and 37, instead of using the diodes 46 and 48.

EMBODIMENT 3

Figure 6:
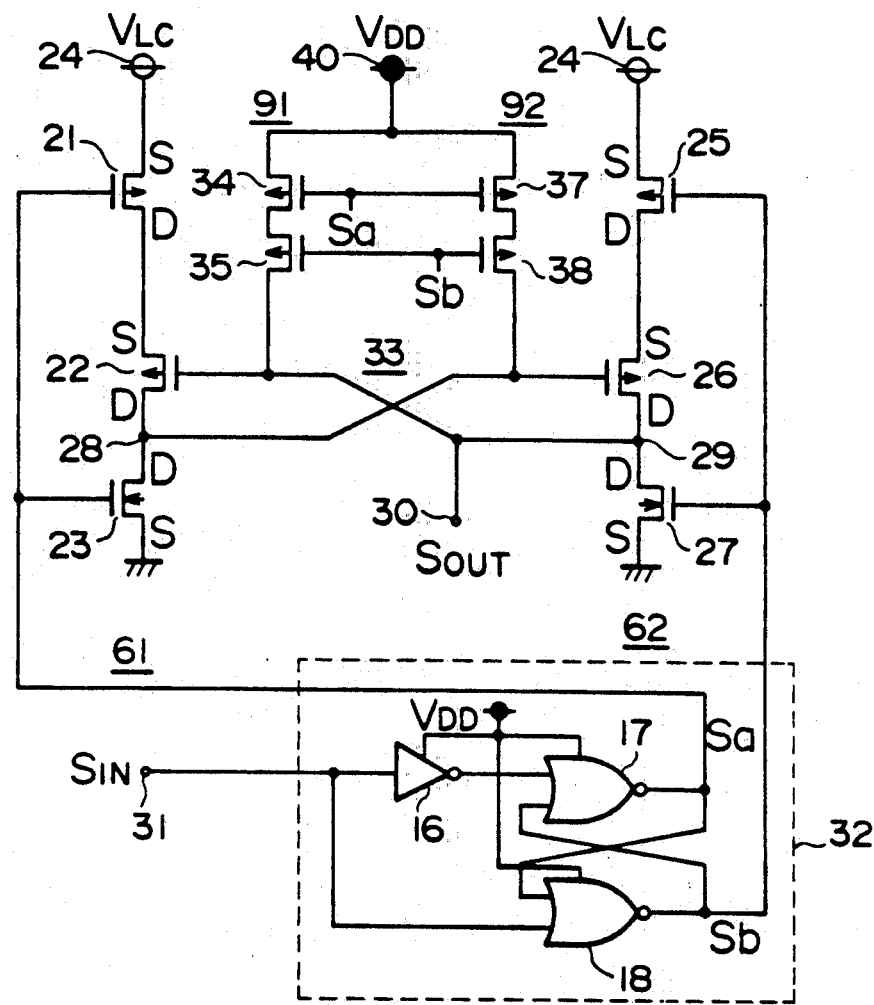
FIG. 6 is a circuit diagram of a level shifter circuit according to a third embodiment of the present invention.

FIG. 6 shows a level shifter circuit according to a third embodiment of the present invention. This arrangement can be used with a $V_{DD}$ voltage supply source connected to the terminal 40, which has a reverse current blocking function in itself. In place of the series combinations 81 and 82 of FIG. 5, a series combination 91 comprising only the PMOS transistor 34 and 35, and a series combination 92 comprising only the PMOS transistors 37 and 38 are used in the output level setting circuit 33. The diodes 46 and 48 which are used in the FIG. 5 circuit are not used in the circuit of the third embodiment.

As described in detail above, in the level shifter circuit according to the present invention, current which flows through the inverter circuits constituting the level shifter when the input signal $S_{IN}$ switches from the L-level to the H-level or from the H-level to the L-level, is significantly minimized so that power consumption during operation is significantly reduced relative to conventional circuits. In the above-described level shifter circuit of the present invention, the first and second inverter circuits 61, 62 are operated from a voltage $V_{LC}$, $V_{LC}$ may equal 3 V and be supplied from a first voltage supply so that the output signal $S_{OUT}$ switches between the ground potential and $V_{LC}=3\ V$ to drive a liquid crystal display device. A signal generating the circuit (not shown), providing the input signal $S_{IN}$, and the input signal circuit 32 generating the signals Sa and Sb from the input signal $S_{IN}$, are designed to be sufficiently operable from 2 V. With this arrangement, a voltage supply providing 3 V, which is equal to $V_{LC}(=3\ V)$, is used for the second voltage supply $V_{DD}$. When both supplies are batteries the first voltage supply can hold $V_{LC}$ at 3 V extended period because of significantly small power consumption of the first and second inverter circuits 61 and 62. Thus when the second voltage $V_{DD}$ falls to 2 V, the output signal $S_{OUT}$ of 3 V required for driving the liquid crystal display device can be developed the input signal $S_{IN}$ of 2 V. Accordingly, when batteries are used as the voltage supply sources, the life of such batteries can be significantly prolonged.

What is claimed is:

1. A level shifter circuit comprising:

first and second inverter circuits, each comprising a first PMOS transistor, a second PMOS transistor and an NMOS transistor which are connected in series between a point of first potential and a point of reference potential; a connection interconnecting an output node of said first inverter circuit and a gate of said second PMOS transistor of said second inverter circuit, and a connection interconnecting an output node of said second inverter circuit and a gate of said second PMOS transistor of said first inverter circuit;

an output terminal disposed at at least one of said output nodes of said first and second inverter circuits;

an input signal circuit for providing to respective inputs of said first and second inverter circuits a pair of input signals Sa, Sb which switch substantially in a complementary manner between a second potential and said reference potential, said second potential being equal to or less than said first potential; and an output level setting circuit responsive to said input signals for forcibly setting simultaneously both of said output nodes of said first and second inverter circuits to said second potential for a short time period whenever said input signals switch.

2. The level shifter circuit according to claim 1 wherein:

said output level setting circuit comprises series connections connected between a point of said second potential and said respective output nodes of said first and second inverter circuits, each of said series connections comprising a first PMOS transistor, a second PMOS transistor and an NMOS transistor;

a gate of said first PMOS transistor in each of said series connections receives one of said substantially complementarily changing input signals;

a gate of said second PMOS transistor in each of said series connections receives the other of said substantially complementarily changing input signals; and a gate of said NMOS transistor in each of said respective series connections receives said second potential.

3. The level shifter circuit according to claim 1 wherein:

said output level setting circuit comprises series connections connected between a point of said second potential and said respective output nodes of said first and second inverter circuits, each of said series connections comprising a first PMOS transistor, a second PMOS transistor and a diode;

a gate of said first PMOS transistor in each of said series connections receives one of said substantially complementarily changing input signals; and a gate of said second PMOS transistor in each of said series connections receives the other of said substantially complementarily changing input signals.

4. The level shifter circuit according to claim 1 wherein:

said output level setting circuit comprises series connections connected between a point of said second potential and said respective output nodes of said first and second inverter circuits, each of said series connections comprising a first PMOS transistor and a second PMOS transistor and a means for preventing a reverse current;

a gate of said first PMOS transistor in each of said series connections receives one of said substantially complementarily changing input signals;

a gate of said second PMOS transistor in each of said series connections receives the other of said substantially complementarily changing input signals; and said means for preventing a reverse current prevents current from flowing from said output nodes of said respective inverter circuits back to a source of said second potential.

5. The level shifter circuit according to any one of claims 1, 2, 3 or 4 wherein said input signal circuit receives at an input thereof an input signal $S_{IN}$ which switches between an low-level and an high level, and produces said pair of input signals Sa, Sb which, in response to said input signal $S_{IN}$, switch in a substantially complementary manner between the reference potential and said second potential and which simultaneously assume the reference potential for a short time whenever said input signal $S_{IN}$ changes its level.

6. The level shifter circuit according to any one of claims 1, 2, 3, or 4 wherein said NMOS transistor in each inverter circuit is dimensioned such that said NMOS transistor, when conductive, exhibits an internal impedance which can maintain said output node substantially at the reference potential regardless of the states of said first and second PMOS transistors of that inverter circuit.

7. A level shifting circuit comprising:

a first and second CMOS inverter each having a first PMOS transistor, a second PMOS transistor, and an NMOS transistor serially connected respectively between a first potential and a reference potential with said first PMOS transistor having a source connected to said first potential and said NMOS transistor having a source connected to said reference potential;

said first and second CMOS inverters each having an output node connected to a gate of said second PMOS transistor of an other of said first and second CMOS inverters;

a first and a second inverter input of said first and second CMOS inverters respectively, each inverter input including gates of said first PMOS transistor and said NMOS transistor said first and second inverter inputs having a first and a second input signal applied thereto respectively;

said first and second input signals being substantially complimentary and changing from said reference potential to a second potential equal to or less than said first potential;

means for forcing said output nodes of said first and second inverters to a potential equal to at least said second potential for a short time period after a transition to said reference potential of one of said first and second input signal 8. A level shifting circuit according to claim 7 wherein said means for forcing comprises:

a first and a second series combination between said second potential and said output nodes of said first and said second CMOS inverters;

said first and said second series combination each including a first and a second PMOS transistor each having a gate;

said first input signal being applied to the gate of one of said first and said second PMOS transistors and said second input signal being applied to the gate of another one of said first and said second PMOS transistors.

9. A level shifting circuit according to claim 7 wherein: said means for forcing comprises:

a first and a second series combination between said second potential and said output nodes of said first and said second CMOS inverters forming a first and a second series connection;

said first and said second series combination each including a first and a second PMOS transistor each having a gate;

said first input signal being applied to the gate of one of said first and said second PMOS transistors and said second input signal being applied to the gate of another one of said first and said second PMOS transistors; and means for current blocking interposed in said first and said second series connections for preventing a flow of current from said first potential to said second potential.

10. A level shifting circuit according to claim 9 wherein said means for current blocking includes a NMOS transistor having a gate with said second potential applied thereto.

11. A level shifting circuit according to claim 9 wherein said means for current blocking includes a diode.

12. A level shifting circuit according to claim 7 further comprising:

an input signal circuit for providing said first and said second input signals responsive to an input signal; and said first and said second input signals being both held at the reference potential for a short time period after a transition of said input signal.

* * * * *